(12) United States Patent
Kim et al.

(10) Patent No.: US 7,864,601 B2
(45) Date of Patent: Jan. 4, 2011

(54) SEMICONDUCTOR MEMORY DEVICE AND METHOD FOR GENERATING PIPE-IN SIGNAL THEREOF

(75) Inventors: Kyoung-Nam Kim, Gyeonggi-do (KR); Ho-Youb Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 246 days.

(21) Appl. No.: 12/164,393

(22) Filed: Jun. 30, 2008

(65) Prior Publication Data
US 2009/0257291 A1    Oct. 15, 2009

(30) Foreign Application Priority Data
Apr. 11, 2008    (KR) .................. 10-2008-0033680

(51) Int. Cl.
*G11C 7/00* (2006.01)

(52) U.S. Cl. ............ 365/189.15; 365/189.05; 365/189.08; 365/233.1; 365/233.17; 365/233.18

(58) Field of Classification Search .......... 365/189.011, 365/189.15, 189.05, 189.08, 233.1, 233.17, 365/233.18
See application file for complete search history.

(56) References Cited

U.S. PATENT DOCUMENTS

| | | | | |
|---|---|---|---|---|
| 6,094,380 | A * | 7/2000 | Kim | 365/194 |
| 6,724,684 | B2 * | 4/2004 | Kim | 365/189.15 |
| 7,450,440 | B2 * | 11/2008 | Kim et al. | 365/189.17 |
| 7,515,482 | B2 * | 4/2009 | Kim et al. | 365/189.05 |
| 2007/0070677 | A1 * | 3/2007 | Shin | 365/78 |

FOREIGN PATENT DOCUMENTS

| | | |
|---|---|---|
| KR | 1020010061390 A | 7/2001 |
| KR | 1020040005844 A | 1/2004 |
| KR | 100653998 B1 | 11/2006 |
| KR | 1020070080455 A | 8/2007 |

OTHER PUBLICATIONS

Notice of Allowance issued from Korean Intellectual Property Office on Nov. 26, 2009.

* cited by examiner

*Primary Examiner*—VanThu Nguyen
(74) *Attorney, Agent, or Firm*—IP & T Group LLP

(57) ABSTRACT

A semiconductor memory device includes a preliminary signal generator configured to output a preliminary pipe-in signal enabled when a read command is applied. A delay unit is configured to delay the preliminary pipe-in signal and output the delayed preliminary pipe-in signal to match the timing of output data. A pipe-in signal generator generates a pipe-in signals that are enabled between a predetermined enable point and a next enable point of the delayed preliminary pipe-in signal output.

8 Claims, 10 Drawing Sheets

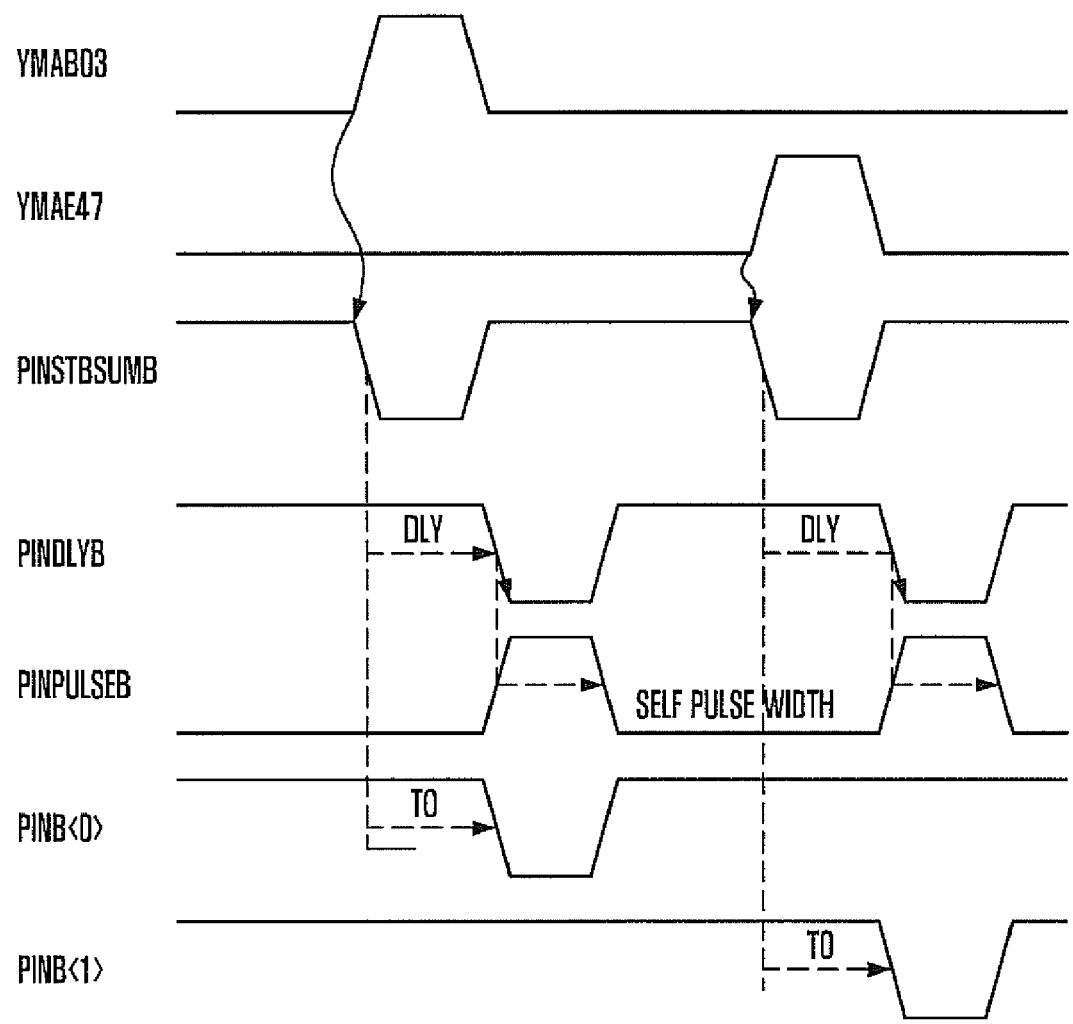

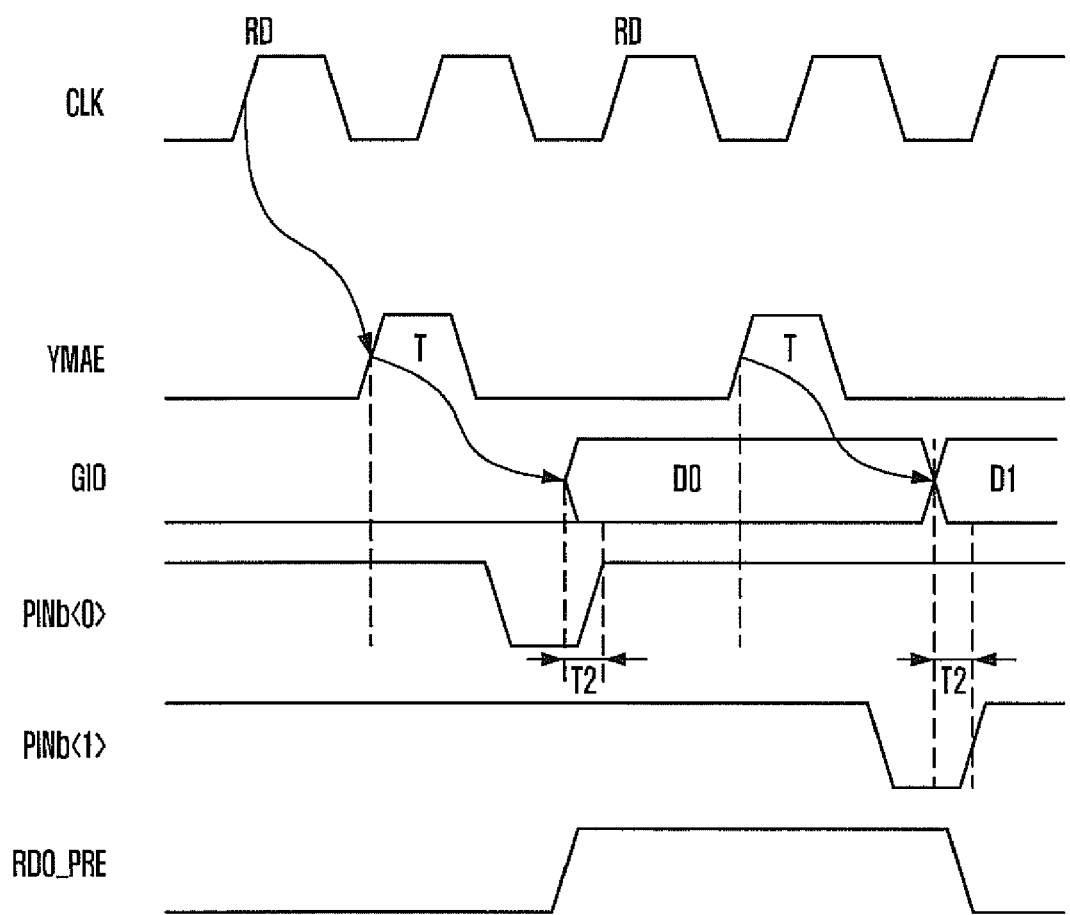

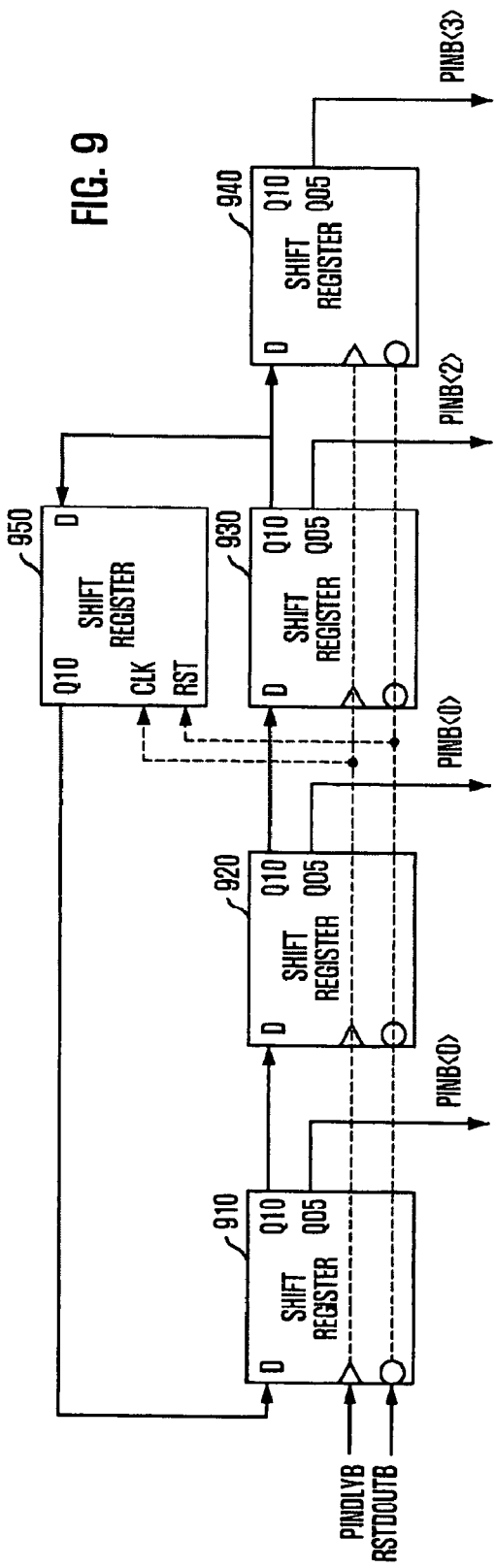
FIG. 9
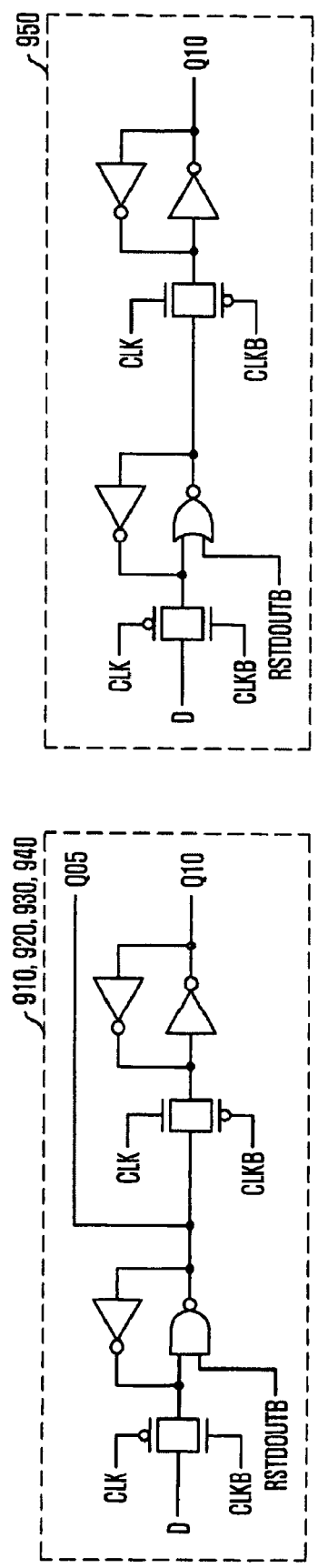

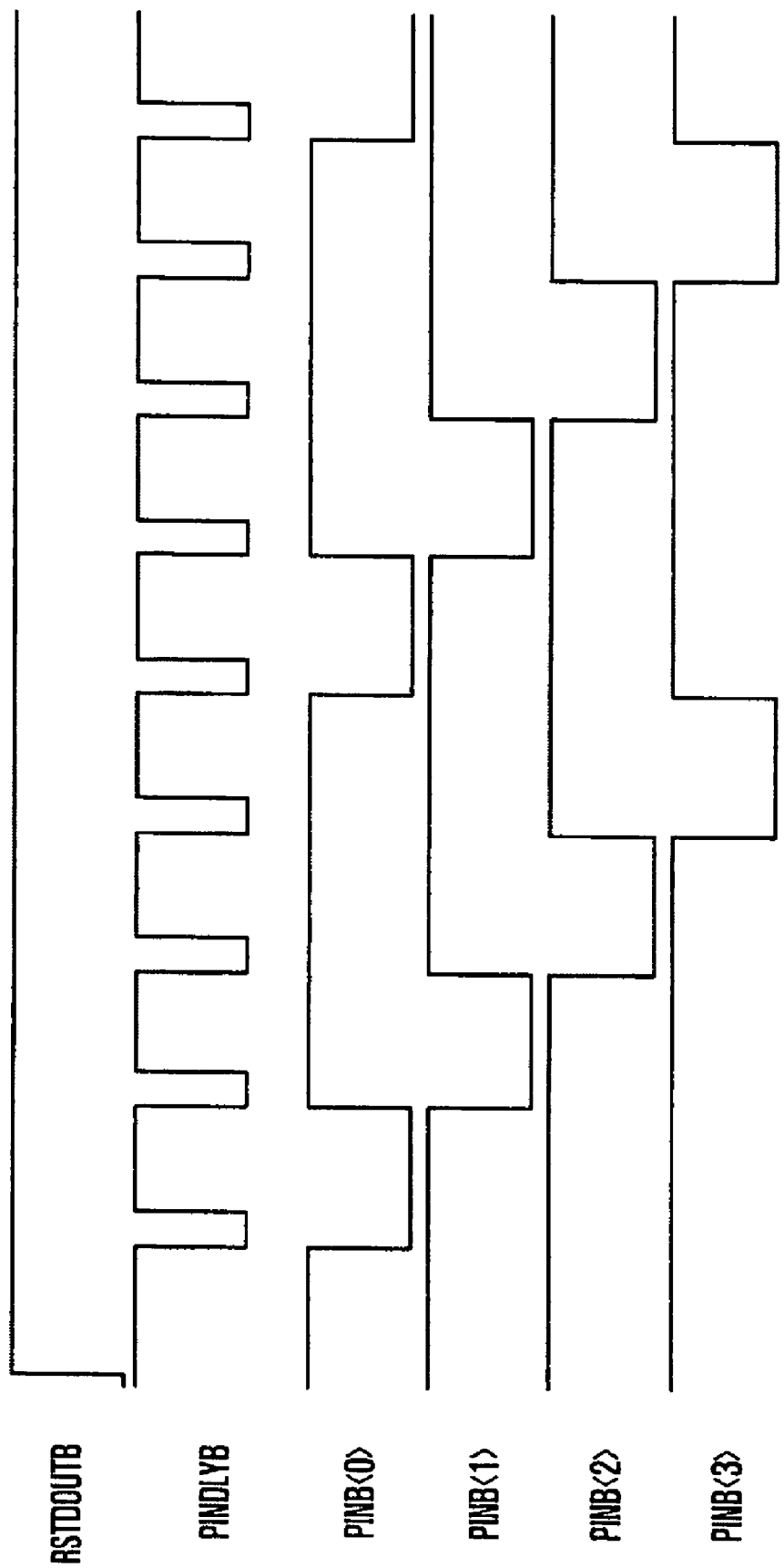

SEMICONDUCTOR MEMORY DEVICE AND METHOD FOR GENERATING PIPE-IN SIGNAL THEREOF

CROSS-REFERENCE TO RELATED APPLICATION

The present invention claims priority of Korean patent application number 10-2008-0033680, filed on Apr. 11, 2008, which is incorporated by reference in its entirety.

BACKGROUND OF THE INVENTION

The present invention relates to a semiconductor memory device, and more particularly, to technology that improves timing of a pipe-in signal, which is a signal conveying data to a pipe latch to allow data to be stably conveyed to the pipe latch.

A semiconductor memory device can receive commands successively from the outside but does not immediately perform the successively received commands. In case of a read operation, a read CAS signal (a kind of an internal read command) should be enabled to perform the read operation. A double data rate 2 (DDR2) semiconductor memory device internally secures a time for performing successive commands by delaying an enable point of the read CAS signal. A delay time until a read CAS signal controlling an internal operation is enabled by a read command is called an additive latency (AL). Also, a time taken until effective data is output from the CAS signal enabled by the additive latency is CAS latency (CL). That is, the read latency taken until a read command is applied and internal data is output is equal to the sum of AL and CL.

As described above, the semiconductor memory device stores data output from a memory array block by a read command in a latch, and outputs the data at a point corresponding to set CAS latency. This is for preventing collision with data successively output next in the case where data is output from the memory array block earlier than the set CAS latency.

Meanwhile, data of a plurality of bits can be output by applying a read command one time. The number of bits output at a time can be determined by setting a burst length of a mode register. Also, the sequence of output data can be determined by setting a burst type of the mode register. The data output sequence is divided into an interleave mode and a sequential mode, and each mode has a different data output sequence.

Specifically, the DDR2 uses a 4-bit prepatch outputting a 4-bit memory cell data per data pin DQ during a read operation.

FIG. 1 is a circuit diagram illustrating a data path of a conventional semiconductor memory device. The data path from a memory array block to an output pad is described.

During a read operation, data is applied from a memory cell 1 inside a memory array block to a bit line (BL, /BL) by a fine voltage. This data is detected by a bit line sense amplifier (BLSA) 2 and amplified to a full voltage level. The data of the bit line sense amplifier 2 is applied to a data bus LIO (LIOB) by a column select signal Y1 enabled by a column address, and this data is amplified again by a main amplifier (or IOSA) 3.

The data of the main amplifier 3 is stored in a pipe latch 4 through a global input/output line GIO, and output to an output driver 5 at a point corresponding to CAS latency. The output driver 5 outputs the data to the outside through a data pad DQ. A path from the main amplifier 3 to the output driver 5 is called a read path.

Also, when data is applied from the outside through the data pad 6 during a write operation, the data passes through a data input buffer 7 and is applied in a device. The output data of the data input buffer 7 is stored in a data input register 8, and transferred to a write driver 9 through a global input/output line GIO. The write driver 9 amplifies the data to transfer the data to a data bus. The data of the data bus is applied to the bit line BL (/BL) of the bit line sense amplifier 2 by a column select signal Y1 enabled by a column address. Therefore, the data applied to the bit line BL (/BL) is stored in the memory cell 1. A path from the data input buffer 7 to the write driver 9 is called a write path.

Hereinafter, the operation of a pipe latch is described in more detail.

FIG. 2 is a block diagram illustrating a global input/output line pipe latch and an output driver inside a conventional semiconductor memory device.

Global input/output lines GIO0, GIO1, GIO2, and GIO3 input data D0-D15 output by application of successive read commands to pipe latches 210, 220, 230, and 240 in parallel. D0, D1, D2, and D3, which are data initially arrive through the global input/output lines GIO0, GIO1, GIO2, and GIO3 are strobed by a pipe latch input signal PINB<0>, and input and stored in the pipe latch 210. D4, D5, D6, and D7, which are the next data are strobed by a pipe latch input signal PINB<1>, and input and stored in the pipe latch 220. Likewise, D8, D9, D10, and D11 are input and stored in the pipe latch 230 by a pipe latch input signal PINB<2>, and D12, D13, D14, and D15 are input and stored in the pipe latch 240 by a pipe latch input signal PINB<3>.

Data input to the same pipe latches 210, 220, 230, and 240 are data read by the same read command. When D0, D1, D2, and D3 are read by an initial read command, D4, D5, D6, and D7 are read by the next read command.

That is, whenever a read command is applied, pipe-in signals PINB<0:3> are sequentially enabled to input data of the global input/output lines GIO0, GIO1, GIO2, and GIO3 to corresponding pipe latches 210, 220, 230, and 240.

Data stored in the pipe latches 210, 220, 230, and 240 are strobed by RPOUTB<0:3> (strobing data of an RDO line) and FPOUTB<0:3> (strobing data of an FDO line), which are signals determining a timing that outputs data from each of the pipe latches 210, 220, 230, and 240, and output to an output driver 250. The output driver 250 outputs these data D0-D15 to the outside of a chip in series through a data pin.

How the data D0, D1, D2, and D3 transferred from the FDO line and the RDO line, which are output lines of the pipe latch 210, are converted and output in series has been briefly illustrated below the output driver 250 in the drawing (D4-D15 are converted in series likewise). The flow of the data D0-D15 can be understood with reference to this illustration.

The pipe latches 210, 220, 230, and 240 store the data D0-D15 to be output, and output the data to the outside of the chip at an appropriate timing, thereby preventing collision between the data D1-D15.

FIG. 3 is a circuit diagram illustrating a unit of the pipe latch 210 that receives data in order to describe the role of a pipe-in signal.

As illustrated in FIG. 3, the unit of the pipe latch 210 that receives data include inverters 311, 312, 313, and 314, enabled to receive data in response to a pipe-in signal PINB<0>, and latches 321, 322, 323, and 324.

While a pipe latch input signal PINB<0> is enabled to 'low', the inverters 311, 312, 313, and 314 are enabled to receive data D0, D1, D2, and D3 of the global input/output lines GI00, GI01, GI02, and GI03. The received data D0, D1, D2, and D3 are stored in the latches 321, 322, 323, and 324. The received data D0, D1, D2, and D3 pass through a circuit in the rear end of the pipe latches and are strobed by RPOUTB<0> and FPOUTB<0> signals, and output to the RDO and FDO lines. Consequently, the data D0, D1, D2, and D3 are output in series through the data pin DQ.

Though the sequence of outputting the data D0, D1, D2 and D3 can change depending on the sequential mode and the interleave mode, the sequence has nothing to do with the invention and description thereof is omitted.

For reference, the data input units of the other pipe latches 220-240 have the same construction as that of the pipe latch 210.

FIG. 4 is a block diagram illustrating a pipe-in signal generating part of a semiconductor memory device, and FIG. 5 is a timing diagram of the pipe-in signal generating part of FIG. 4.

Pipe-in signals PINB<0:3> are generated by a preliminary signal generator 410, a delay unit 420, a pulse width controller 430, and a pipe-in signal generator 440.

The preliminary signal generator 410 generates a preliminary pipe-in signal PINSTSUMB in response to main amplifier enable signals YMAE03 and YMAE47. The signal YMAE03 corresponds to a signal enabled when even one of main amplifiers IOSA of banks 0-3 is enabled. The signal YMAE47 corresponds to a signal enabled when even one of main amplifiers IOSA of banks 4-7 is enabled. The preliminary signal generator 410 enables a preliminary pipe-in signal PINSTSUMB when even one of signals YMAE03 and YMAE47 is enabled. That is, whenever a main amplifier is enabled regardless of the banks, the preliminary pipe-in signal PINSTSUMB is enabled in response thereto. Also, this means that the preliminary pipe-in signal PINSTSUMB is enabled whenever a read command is applied.

The delay unit 420 delays a preliminary pipe-in signal PINSTSUMB to output the same. Data amplified by the main amplifier 3 passes through a long global input/output line GIO and is transferred to the pipe latch 4. Therefore, the data passes through a considerable delay until the data arrive from the main amplifier 3 to the pipe latch 4, and a pipe-in signal PINB<0:3> that should arrive at a corresponding timing should be also delayed. The delay unit 420 provides this delay value. Though the delay unit 420 is illustrated as one block in the drawing, a simply long transmission line can have a sufficient delay value. Accordingly, the delay unit 420 can be a simply long transmission line.

The pulse width controller 430 controls the width, i.e., the pulse width of the enable section of a preliminary pipe-in signal PINSTSUMB whose delay value has been controlled by the delay unit 420, to output the same.

The pipe-in signal generator 440 sequentially enables pipe-in signals PINB<0:3> whenever a preliminary pipe-in signal PINPULSEB is enabled once. When a preliminary pipe-in signal PINPULSEB is enabled initially, PINB<0> is enabled, and after that, PINB<1>, PINB<2>, and PINB<3> are sequentially enabled. After PINB<3> is enabled, PINB<0> is enabled again. A reset signal RSTDOUTB is a signal initializing the operation of the pipe-in signal generator 440. When the reset signal RSTDOUTB is enabled, pipe-in signals are enabled again from PINB<0>. For example, when a reset signal RSTDOUTB is enabled after PINB<2> is enabled, and a preliminary pipe-in signal PINPULSEB is enabled, then pipe-in signals are enabled again from PINB<0>.

A process of generating pipe-in signals PINB<0:3> is described in sequence with reference to FIG. 5. When a read command is applied and main amplifiers of banks 0-3 are enabled (YMAE03 'high') or main amplifiers of banks 4-7 are enabled (YMAE47 'high'), a preliminary pipe-in signal PINSTSUMB is enabled as 'low'. Also, the preliminary pipe-in signal PINSTSUMB is delayed (PINDLYB) by the delay unit 420 to control a timing with data input, and the pulse width of an enable section is controlled (PINPULSEB) by the pulse width controller 430. Also, pipe-in signals PINB<0:3> are sequentially enabled as 'low' in response thereto.

FIGS. 6A and 6B are timing diagrams for explaining problems occurring when a pipe-in signal is generated using a conventional method.

Referring to FIG. 6A, a main amplifier enable signal YMAE (illustrated regardless of banks in the present drawing) is enabled and a main amplifier is enabled by application of a read command RD. Therefore, data D0 and D1 are transferred from local input/output lines LIO/LIOB to a global input/output line GIO. A pipe-in signal PINB<0> is enabled in response to a main amplifier enable signal YMAE enabled first. A pipe-in signal PINB<1> is enabled in response to a main amplifier enable signal YMAE enabled second. Also, the pipe-in signal PINB<0> inputs data D0 to a pipe latch, and the pipe-in signal PINB<1> inputs data D1 to a pipe latch.

At this point, since pipe-in signals PINB<0> and PINB<1> are enabled within the section of the data D0 and D1, the data D0 and D1 can be stably input to the latches.

FIG. 6B illustrates data transfer of a GIO gets slow and the timing of a pipe-in signal gets fast due to a condition change inside a chip.

Referring to FIG. 6B, a pipe-in signal PINB<0> can input data D0 to a pipe latch for only time T2, and a pipe-in signal PINB<1> can input data D1 to a pipe latch for only time T2.

The pipe-in signal PINB<1> is a signal inputting the data D1 to a pipe latch. Correct data D1 needs to be input until a pipe latch is closed (data stored before a pipe latch is closed by the disabled PINB<1> is D1). False data D0 is input when a pipe-in signal is enabled initially and then D1, which is correct data, is input later. However, the time T2 is so short that stably inputting data D1 to a pipe latch cannot be guaranteed.

In case of generating a pipe-in signal using a conventional method, data cannot be stably input to a pipe lath when a PVT condition, etc. inside a chip changes. Since a fact that data is not stably input to a pipe latch means that a memory device outputs false data consequently, a read operation failure is caused.

SUMMARY OF THE INVENTION

Embodiments of the present invention are directed to providing technology allowing data to be input to a pipe latch with a sufficient margin by securing a maximum enable section of a pipe-in signal.

In accordance with an aspect of the invention, there is provided a semiconductor memory device, comprising a preliminary signal generator configured to output a preliminary pipe-in signal enabled when a read command is applied, a delay unit configured to delay the preliminary pipe-in signal and output the delayed preliminary pipe-in signal to match timing with output data, and a pipe-in signal generator configured to generate a plurality of pipe-in signals enabled during a section between a predetermined enable point and a next enable point of the delayed preliminary pipe-in signal output.

In accordance with another aspect of the invention, a method for generating a pipe-in signal in a semiconductor memory device, the method comprising enabling a preliminary pipe-in signal in response to the read command, when a read command is applied, delaying the preliminary pipe-in signal to match timing with output data, and generating a plurality of pipe-in signals enabled during a section from a predetermined enable point to a next enable point of the delayed preliminary pipe-in signal.

BRIEF DESCRIPTION OF THE DRAWINGS

FIG. 5 is a timing diagram of the pipe-in signal generating part of FIG. 4.

FIGS. 6A and 6B are timing diagrams for explaining problems occurring when a pipe-in signal is generated using a conventional method.

FIG. 9 is a circuit diagram of the pipe-in signal generator 730 of FIG. 7.

FIG. 10 is a timing diagram illustrating the operation of the pipe-in signal generator of FIG. 9.

DESCRIPTION OF SPECIFIC EMBODIMENT

Hereinafter, a semiconductor memory device and a method for generating a pipe-in signal thereof in accordance with an embodiment of the present invention will be described in detail with reference to the accompanying drawings.

Figure 1:
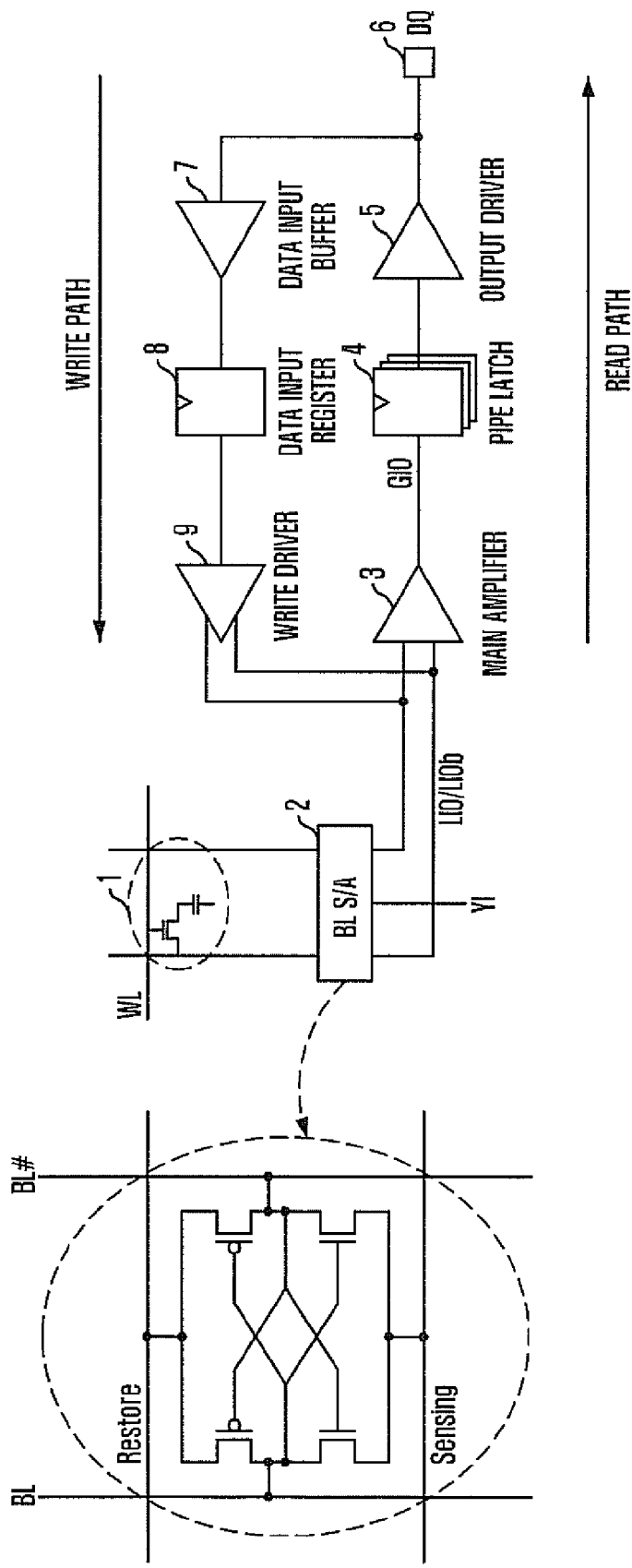
FIG. 1 is a circuit diagram illustrating a data path of a conventional semiconductor memory device.
Figure 2:
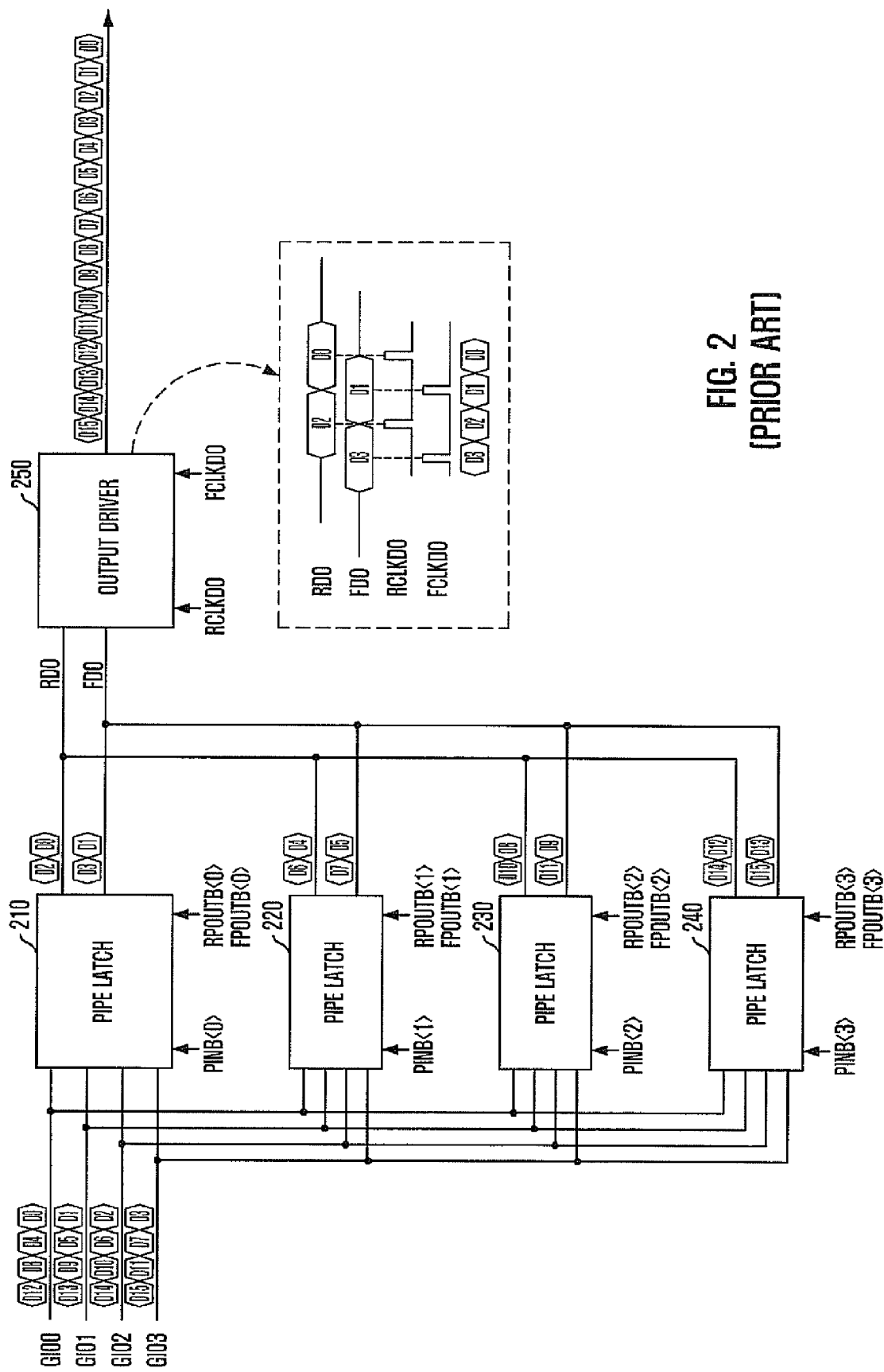
FIG. 2 is a block diagram illustrating a global input/output line pipe latch and an output driver inside a conventional semiconductor memory device.
Figure 3:
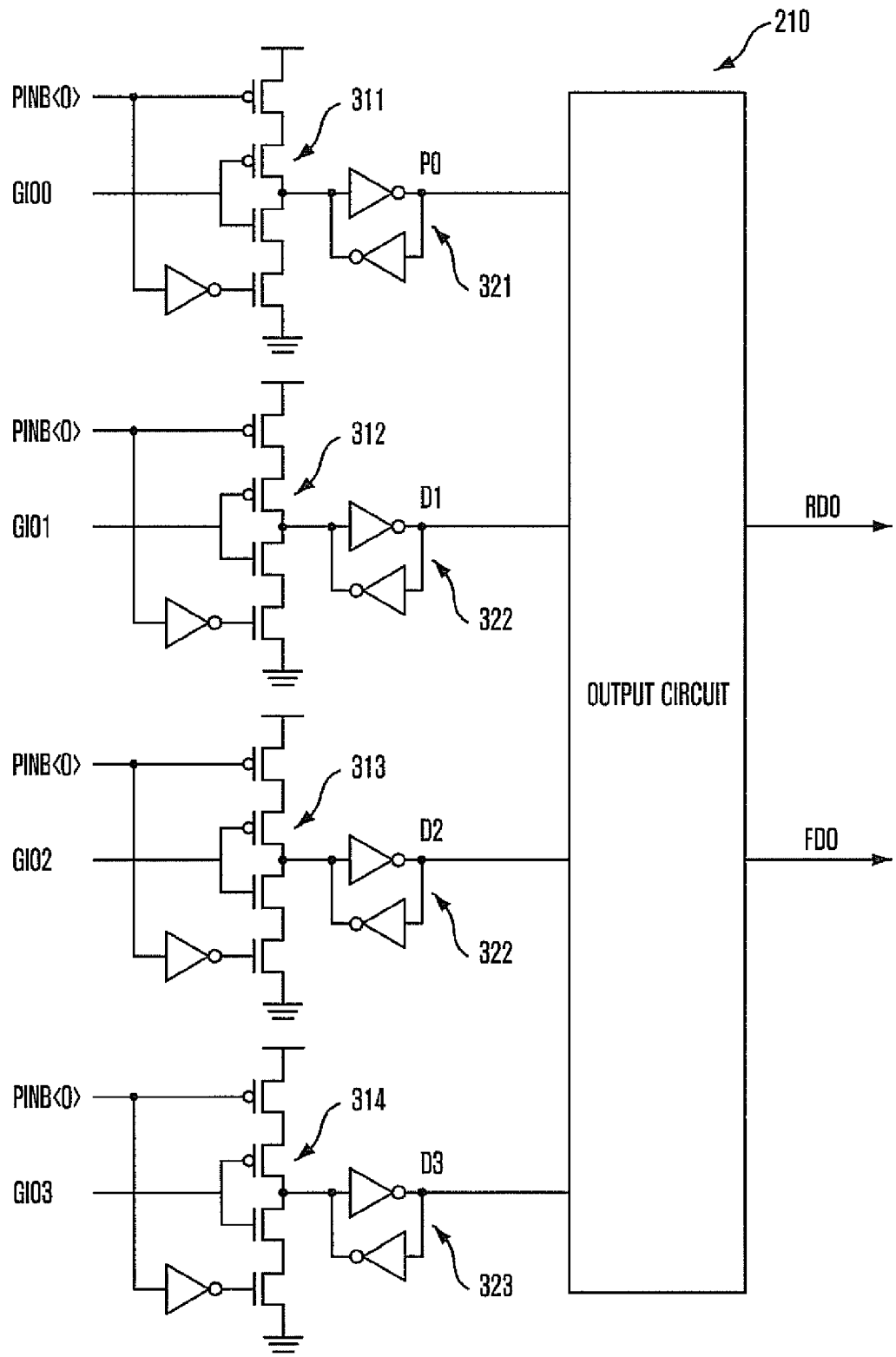
FIG. 3 is a circuit diagram illustrating a unit of the pipe latch 210 that receives data in order to describe the role of a pipe-in signal.
Figure 4:
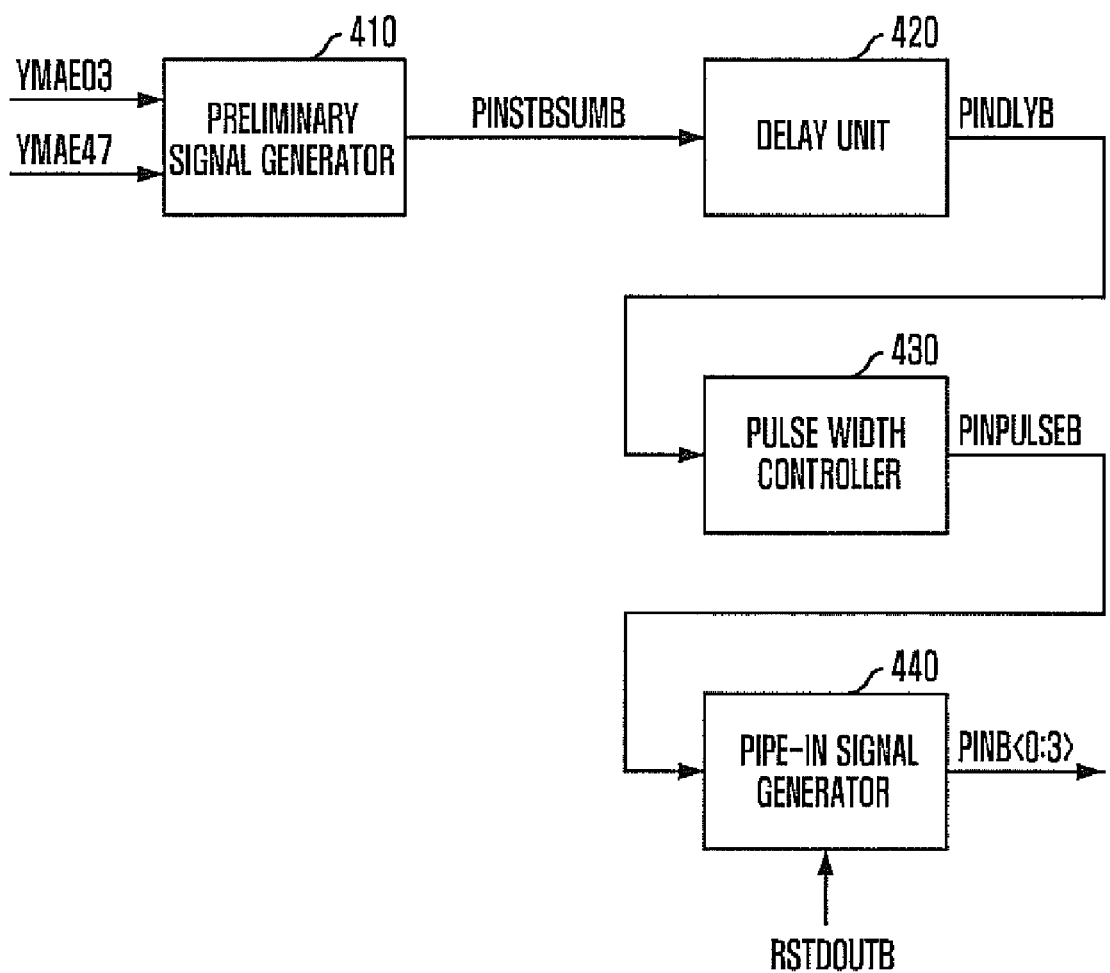
FIG. 4 is a block diagram illustrating a pipe-in signal generating part of a semiconductor memory device.
Figure 6A:
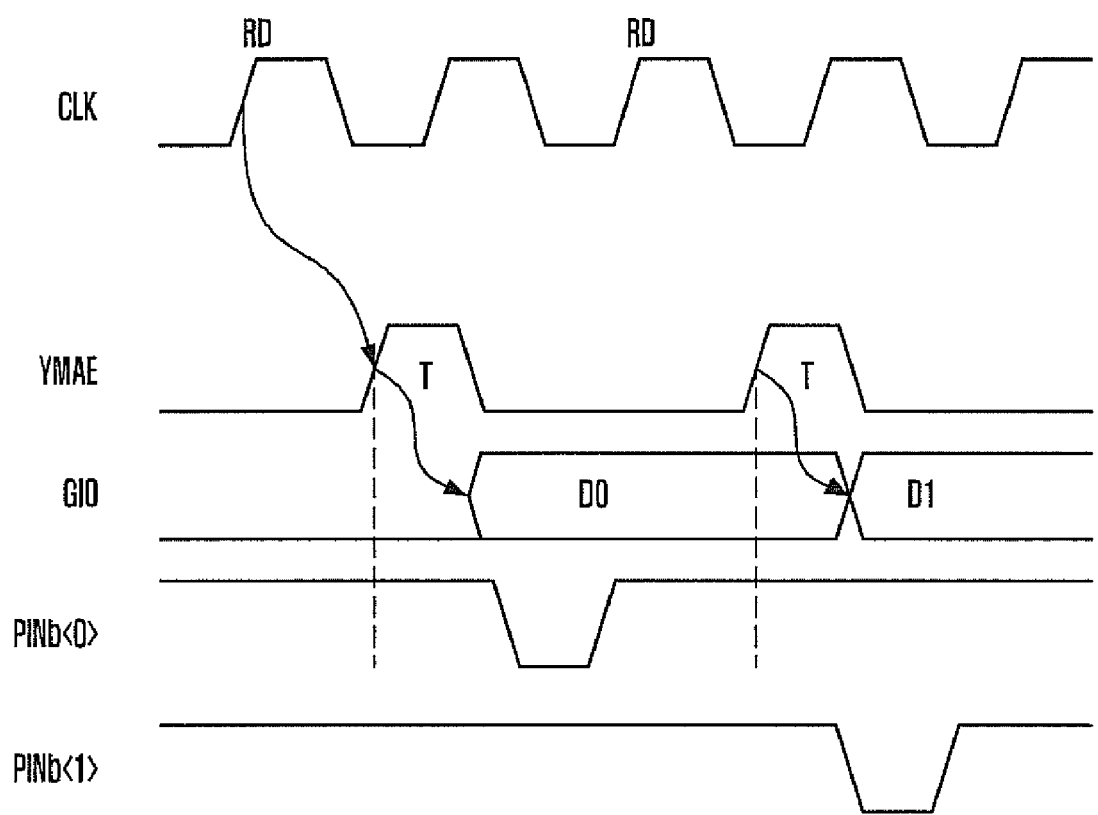
Figure 7:
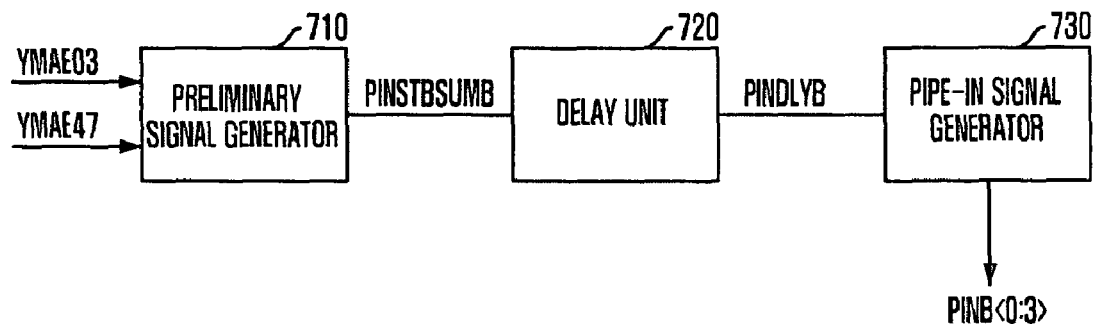
FIG. 7 is a block diagram illustrating a pipe-in signal generating part of a semiconductor memory device accordance with an embodiment of the present invention.

FIG. 7 is a block diagram illustrating a pipe-in signal generating part of a semiconductor memory device accordance with an embodiment of the invention.

The semiconductor memory device generates pipe-in signals PINB<0:3> using a preliminary signal generator 710, a delay unit 720, and a pipe-in signal generator 730.

The preliminary signal generator 710 outputs a preliminary pipe-in signal PINSTSUMB enabled whenever a read command is applied. In detail, the preliminary signal generator 710 enables a preliminary pipe-in signal PINSTSUMB when any one of main amplifier enable signals YMAE is enabled. Since one of main amplifiers is enabled when a read command is applied, one of YMAE03 (signal obtained by performing an OR-operation on YMAEs of banks 0-3) and YMAE47 (signal obtained by performing an OR-operation on YMAEs of banks 4-7) must be enabled. A preliminary pipe-in signal PINSTSUMB is enabled when any one of YMAE03 and YMAE47 is enabled. That is, the preliminary pipe-in signal PINSTSUMB is enabled whenever a read command is applied.

The delay unit 720 delays a preliminary pipe-in signal PINSTSUMB to output the same (PINDLYB) to match timing with output data. A pipe-in signal PINB<0:3> should arrive and be enabled at a similar timing to that of data to be output. Since data is transferred through a global input/output line GIO having a large loading, the data arrives at a pipe latch with a considerable delay value. Therefore, the delay 720 delays a preliminary pipe-in signal PINSTSUMB to correspond to this delay.

Since the invention is characterized in securing the maximum pulse width of a pipe-in signal PINB<0:3>, a margin can be given to a time at which data is input to a pipe latch even when the enable timing of the pipe-in signal PINB<0:3> is fast than the conventional art. Even when the pipe-in signal PINB<0:3> is enabled early and false data (old data before data to be input) is input to the pipe latch for a short while, correct data will be input to the pipe latch when the pipe latch is closed because the enable section of the pipe-in signal PINB<0:3> is long.

Though the delay unit 720 is illustrated as one block in the drawing, a simply long transmission line can have a sufficient delay value. Accordingly, the delay unit 720 can be a simply long transmission line.

The pipe-in signal generator 730 generates a plurality of pipe-in signals PINB<0:3> enabled during a section from a predetermined enable point to the next enable point of a preliminary pipe-in signal PINDLYB output from the delay unit 720. Whenever the preliminary pipe-in signal PINDLYB is enabled, the pipe-in signals PINB<0:3> are sequentially enabled, which will be described in detail.

When a preliminary pipe-in signal PINDLYB is enabled initially, a pipe-in signals PINB<0> is enabled in response to the preliminary pipe-in signal PINDLYB. Also, when a preliminary pipe-in signal PINDLYB is enabled second, the pipe-in signal PINB<0> is disabled and a pipe-in signals PINB<1> is enabled in response the preliminary pipe-in signal PINDLYB.

Likewise, when a preliminary pipe-in signal PINDLYB is enabled third, a pipe-in signal PINB<2> is enabled. As described above, the pipe-in signals PINB<0:3> are enabled in a sequence of 0, 1, 2, 3, 0, 1, 2, 3, . . . whenever the preliminary pipe-in signal PINDLYB is enabled, and an enabled section is maintained until next pipe-in signals PINB<0:3> are enabled.

That is, data can be stably input to a pipe latch by securing the maximum size of the enable section while allowing the enable sections of the pipe-in signals PINB<0:3> not to overlap each one another.

An RSTDOUTB signal is an initial signal. When the RSTDOUTB signal is enabled, the pipe-in signals PINB<0:3> is enabled again from PINB<0> regardless of previously enabled pipe-in signals PINB<0:3>.

Figure 8:
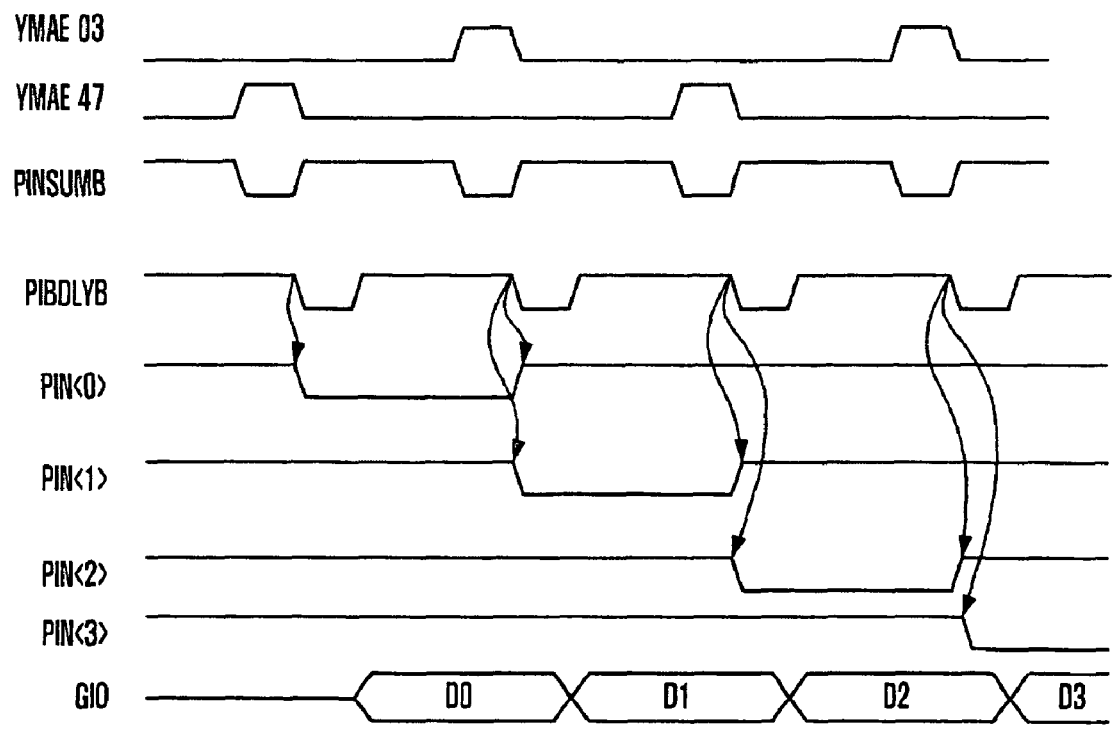
FIG. 8 is a timing diagram of the pipe-in signal generating part of FIG. 7.

FIG. 8 is a timing diagram of the pipe-in signal generating part of FIG. 7.

One of main amplifiers of banks 0-3 is enabled (YMAE03 enable) by application of a read command, so that data D0 is transferred to a global input/output line GIO. Also, one of main amplifiers of banks 4-7 is enabled (YMAE47 enable) by application of successive read commands, so that data D1 is transferred to a global input/output line GIO.

Also, when YMAE03 and YMAE47 are enabled, a preliminary pipe-in signal PINSTSUMB is enabled. The preliminary pipe-in signal PINSTSUMB is delayed by the delay unit 720 and transferred to the pipe-in signal generator 730. The pipe-in signal generator 730 sequentially enables pipe-in signals PINB<0:3> in response to the preliminary pipe-in signal PINSTSUMB.

Since a pipe-in signal PINB<0> is enabled until a next pipe-in signal PINB<1> is enabled, it can be enabled while securing a sufficient pulse width. The secured pulse width allows data D0 to be stably input to a pipe latch for a sufficient time. Of course, the next pipe-in signal PINB<1> can stably input data D1 to a pipe latch for a sufficient time.

FIG. 9 is a circuit diagram of the pipe-in signal generator 730 of FIG. 7.

The pipe-in signal generator 730 includes a plurality of shift registers 910-940 each configured to transfer a signal stored therein to a next register in response to a preliminary pipe-in signal, and a feedback shift register 950 configured to feed back a signal of the shift register 930 of the plurality of the shift registers that is located before the last shift register 940 to the first shift register 910. Signals stored in the plurality of the shift registers 910-940, respectively, are output as a plurality of pipe-in signals PINB<0:3>.

Since the inner circuits of the shift registers 910-940 and the feedback shift register 950 are illustrated in the lower portion of FIG. 9, the lower portion can be referred to for the detailed construction of the inner circuits.

The shift registers 910-940 transfer a signal stored therein to a next shift register 910-940 whenever a preliminary pipe-in signal PINDLYB input to a clock terminal CLK toggles once. Likewise, the feedback shift register 950 transfers a signal stored therein to a next shift register 910 whenever a preliminary pipe-in signal PINDLYB input to a clock terminal CLK toggles once. Only difference is that the initial values (signal of terminal Q5) of the shift registers 910-940 are 'high', while the initial value (signal of NET37 terminal) of the feedback shift register 950 is 'low'.

In operation, while a reset signal RSTOUTB, which is an initialization signal, is enabled as 'low', a signal of 'low' is stored in the feedback shift register 950 and a signal of 'high' is stored in the shift registers 910-940.

With this state, the preliminary pipe-in signal PINDLYB toggles once, the signal of 'low' stored in the feedback shift register 950 is transferred to the shift register 910. Therefore, only a signal PINB<0> is enabled as 'low'. Here, when the preliminary pipe-in signal PINDLYB toggles one more time, a signal of the shift register 910 is transferred to the shift register 920, so that only a signal PINB<1> is enabled as 'low'.

Since a signal enabled as 'low' is transferred to a next shift register 910-940 whenever the preliminary pipe-in signal PINDLYB toggles, pipe-in signals PINB<0:3> can be enabled in turns.

FIG. 10 is a timing diagram illustrating the operation of the pipe-in signal generator of FIG. 9.

Referring to FIG. 10, a reset signal RSTOUTB, which is an initialization signal, is enabled as 'low' and then disabled as 'high'. Pipe-in signals PINB<0:3> are enabled as 'low' in turns whenever the preliminary pipe-in signal PINDLYB toggles.

That is, as described with reference to FIG. 8, pipe-in signals PINB<0:3> are enabled in turns.

A method for generating a pipe-in signal in a semiconductor memory device in accordance with an embodiment of the invention is described with reference to FIGS. 7 to 10 again.

The method for generating the pipe-in signal in the semiconductor memory device includes: whenever a read command is applied, enabling a preliminary pipe-in signal PINSTSUMB in response to the read command; delaying the preliminary pipe-in signal PINSTSUMB to match timing with output data; and generating a plurality of pipe-in signals PINB<0:3> enabled during a section from a predetermined enable point to a next enable point of the delayed preliminary pipe-in signal PINDLYB.

Here, the pipe-in signals PINB<0:3> are sequentially enabled in the sequence of PINB<0>, PINB<1>, PINB<2>, and PINB<3>.

A preliminary pipe-in signal PINSTSUMB can be enabled whenever a read command is applied by enabling the preliminary pipe-in signal PINSTSUMB in response to main amplifier enable signals YMAE03 and YMAE47 enabled by a read command.

Also, pipe-in signals PINB<0:3> can be sequentially enabled whenever a preliminary pipe-in signal PINDLYB is enabled by allowing a previous pipe latch signal PIN<0:3> to be a next pipe latch signal PIN<0:3> using the shift registers 910-950. That is, pipe-in signals PINB<0:3> can be sequentially enabled whenever a preliminary pipe-in signal PINDLYB is enabled by allowing the (N−1)-th pipe-in signal (where N is an integer greater than 2) to be transferred as the N-th pipe-in signal (for example, PINB<0> is transferred as PINB<1>), and allowing the last pipe-in signal to be transferred as the first pipe-in signal (for example, PINB<3> is transferred as PINB<0>).

A semiconductor memory device in accordance with an embodiment of the invention enables a pipe-in signal by a section width between a previous read command and a next read command. The maximum pulse width of a pipe-in signal can be secured using this method, and consequently, data can be input to a pipe latch while securing a stable margin.

While the invention has been described with respect to the specific embodiments, it will be apparent to those skilled in the art that various changes and modifications may be made without departing from the spirit and scope of the invention as defined in the following claims.

Particularly, though the above embodiment has described four pipe-in signals PINB<0:3> are sequentially enabled, it is obvious that the number of necessary pipe-in signals can change depending on the latency of a semiconductor device and the number of pipe latches that should be provided.

What is claimed is:

1. A semiconductor memory device, comprising:
   a preliminary signal generator configured to output a preliminary pipe-in signal, wherein the preliminary pipe-in signal is enabled when a read command is applied;
   a delay unit configured to delay the preliminary pipe-in signal and output the delayed preliminary pipe-in signal to match timing with output data; and
   a pipe-in signal generator configured to generate a plurality of pipe-in signals, wherein the pipe-in-signals are each enabled between a respective first enable point and a respective next enable point of the delayed preliminary pipe-in signal,
   wherein the pipe-in signal generator comprises:
      a plurality of shift registers each configured to transfer a signal stored therein to a next shift register in response to the delayed preliminary pipe-in signal; and
      a feedback shift register configured to feed back an output signal of the next to the last shift register in sequence among the plurality of shift registers to a first shift register in sequence of the plurality of shift registers.
      wherein signals stored in the plurality of shift registers are output as the plurality of pipe-in signals, and the plurality of shift registers are initialized by an initial value that is different than an initial value of the feedback shift register.

2. The semiconductor memory device of claim 1, wherein the preliminary pipe-in signal is enabled when a main amplifier is enabled by the read command.

3. The semiconductor memory device of claim 1, wherein the plurality of pipe-in signals are enabled sequentially.

4. The semiconductor memory device of claim 1, wherein the delay unit has a delay value for controlling the pipe-in signal and the plurality of pipe-in signals are each enabled at a point of time earlier than a point of time at which the output data that the pipe-in signal is generated for arrives at a pipe latch.

5. A method for generating a pipe-in signal in a semiconductor memory device, the method comprising:
   enabling a preliminary pipe-in signal in response to a read command;
   delaying the preliminary pipe-in signal to match timing with output data; and
   generating a plurality of pipe-in signals which are each enabled between a respective first enable point and a respective next enable point of the delayed preliminary pipe-in signal;
   wherein the generating of the plurality of pipe-in signals comprises:
      shifting an initial signal to output a plurality of shifted signals when the delayed preliminary pipe-in signal is toggled during a deactivation of a reset signal; and
      outputting the plurality of shifted signals as the plurality of pipe-in signals, wherein the next to the last shifted signal in sequence among the plurality of shifted signals is fed back as the initial signal during an activation of the reset signal.

6. The method of claim 5, wherein enabling of the preliminary pipe-in signal enabling comprises enabling the preliminary pipe-in signal in response to a main amplifier enable signal which in turn is enabled by the read command.

7. The method of claim 5, wherein the plurality of pipe-in signals are enabled sequentially.

8. The method of claim 5, wherein the plurality of pipe-in signals are each enabled at a point of time earlier than a point of time at which the output data that the pipe-in signal is generated for arrives at a pipe latch.

* * * * *